United States Patent
Wagoner et al.

(10) Patent No.: US 9,681,568 B1
(45) Date of Patent: Jun. 13, 2017

(54) COMPACT STACKED POWER MODULES FOR MINIMIZING COMMUTATING INDUCTANCE AND METHODS FOR MAKING THE SAME

(71) Applicant: GE Energy Power Conversion Technology Ltd, Rugby, Warwickshire (GB)

(72) Inventors: Robert Gregory Wagoner, Salem, VA (US); Allen Michael Ritter, Salem, VA (US)

(73) Assignee: GE ENERGY POWER CONVERSION TECHNOLOGY LTD, Rugby, Warwickshire (GB)

( * ) Notice: Subject to any disclaimer, the term of this patent is extended or adjusted under 35 U.S.C. 154(b) by 13 days.

(21) Appl. No.: 14/956,825

(22) Filed: Dec. 2, 2015

(51) Int. Cl.
*H05K 7/02* (2006.01)
*H02M 7/00* (2006.01)

(52) U.S. Cl.
CPC ............. *H05K 7/023* (2013.01); *H02M 7/003* (2013.01)

(58) Field of Classification Search
CPC ...... H02M 7/003; H02M 7/515; H02M 7/521; H02M 2007/4803; H05K 7/02; H05K 7/023; H05K 7/1452; H05K 7/1459
See application file for complete search history.

(56) References Cited

U.S. PATENT DOCUMENTS

| | | | |
|---|---|---|---|
| 2,592,737 A | 4/1952 | Reynolds, Jr. et al. | |
| 3,454,833 A | 7/1969 | Hurtle | |
| 3,638,095 A | 1/1972 | Jackson | |
| 3,644,818 A | 2/1972 | Paget | |
| 3,646,394 A | 2/1972 | Swartz et al. | |
| 3,972,627 A | 8/1976 | Rabl et al. | |
| 4,054,390 A | 10/1977 | Rabl | |
| 4,074,939 A | 2/1978 | Rabl | |
| 4,459,519 A | 7/1984 | Erdman | |
| 4,514,712 A | 4/1985 | McDougal | |
| 4,859,911 A | 8/1989 | Kinnard et al. | |
| 5,278,380 A | 1/1994 | Lowry | |
| 5,622,563 A | 4/1997 | Howe et al. | |
| 5,668,439 A | 9/1997 | Snelling et al. | |

(Continued)

FOREIGN PATENT DOCUMENTS

| | | |
|---|---|---|
| EP | 0087528 A1 | 9/1983 |
| EP | 0278253 A1 | 8/1988 |

(Continued)

*Primary Examiner* — Matthew Nguyen
(74) *Attorney, Agent, or Firm* — GE Global Patent Operation; Scott R. Stanley

(57) ABSTRACT

A compact stacked power module including a positive direct-current-bus-voltage plate having a positive-plate surface and a negative direct-current-bus-voltage plate having a negative-plate surface. The compact stacked power module also includes an alternating-current output plate having opposing first and second output-plate surfaces, a first semiconductor switch contacting the negative-plate surface and the first output-plate surface, and a second semiconductor switch contacting the positive-plate surface and the second output-plate surface. The compact stacked power module further includes a capacitor contacting the negative-plate surface and the positive-plate surface, wherein the capacitor is electrically in parallel with the first and second semiconductor switches.

20 Claims, 7 Drawing Sheets

(56) References Cited

U.S. PATENT DOCUMENTS

| | | | |
|---|---|---|---|
| 5,859,383 A | 1/1999 | Davison et al. | |
| 5,991,085 A | 11/1999 | Rallison et al. | |
| 6,369,952 B1 | 4/2002 | Rallison et al. | |
| 6,636,429 B2 * | 10/2003 | Maly | H01L 23/50 |
| | | | 257/666 |
| 7,377,180 B2 | 5/2008 | Cunningham | |
| 8,711,565 B2 | 4/2014 | Wagoner et al. | |
| 9,246,408 B2 * | 1/2016 | Maeda | H02M 7/003 |
| 2011/0304948 A1 * | 12/2011 | Lee | H01G 9/155 |
| | | | 361/301.1 |
| 2012/0265196 A1 | 10/2012 | Turner et al. | |
| 2013/0256274 A1 | 10/2013 | Faulkner | |
| 2014/0113828 A1 | 4/2014 | Gilbert et al. | |
| 2014/0153189 A1 * | 6/2014 | Okamura | H05K 1/0213 |
| | | | 361/688 |
| 2014/0230571 A1 | 8/2014 | Pape et al. | |
| 2016/0020707 A1 * | 1/2016 | Fukumasu | H02M 7/003 |
| | | | 363/131 |

FOREIGN PATENT DOCUMENTS

| | | |
|---|---|---|
| EP | 0950276 A1 | 10/1999 |
| EP | 1941232 A2 | 7/2008 |
| EP | 2691996 A2 | 2/2014 |
| WO | 9607947 A1 | 3/1996 |
| WO | 2013158537 A2 | 10/2013 |
| WO | 2014145018 A2 | 9/2014 |

\* cited by examiner

COMPACT STACKED POWER MODULES FOR MINIMIZING COMMUTATING INDUCTANCE AND METHODS FOR MAKING THE SAME

I. TECHNICAL FIELD

The present technology relates generally to electrical power modules. In some embodiments, the technology relates more particularly to stacked electrical power modules configured to minimize commutating inductance in one or more loops thereof in operation of the module.

II. BACKGROUND

Half-bridge and H-bridge electrical circuits are popular for a wide variety of applications. Half-bridge circuits consist of an upper switch, a lower switch, and a capacitor connected in parallel with the switches.

Generally, an H-bridge includes two half-bridges. An H-bridge can be used in a single-phase inverter, for instance. Multiple H-bridges can be connected in series for use in a modular multilevel converter (M2C).

A shortcoming of conventional half-bridge and H-bridge circuits is that undesirably high levels of commutating inductance develops in loops between module switches and local capacitor(s).

Other challenges associated with conventional H-bridges and half-bridges include overheating and development of unwanted strain in the capacitor(s).

III. SUMMARY OF THE EMBODIMENTS

Given the aforementioned deficiencies, there is a need for circuit arrangements, such as half-bridge and H-bridge circuits, in which commutating inductance is eliminated or significantly lower than in conventional circuits for similar purposes.

Minimizing commutating inductance has benefits including increasing reliability of the circuit and so of the device in which the circuit is implemented. Circuits having lower commuting inductance can deliver higher output voltages over time.

The present technology accomplishes this and other goals in various embodiments. In one embodiment, a power module includes a bridge circuit in which size of loops, between switches and corresponding capacitor(s), is reduced significantly compared to conventional circuits.

Minimum loop sizes are achieved by configuring and arranging circuit components in a close-coupled manner to form an ultra-small, or ultra-compact, module.

References herein to how a feature is arranged can refer to, but are not limited to, how the feature is positioned with respect to other features. References to how a feature is configured can refer to, but are not limited to, how the feature is sized, how it is shaped, and/or material of the feature. For simplicity, the term configured is used at times herein to refer to both concepts—configuration and arrangement.

In various embodiments the technology also includes features for relieving strain that may develop otherwise in ceramic capacitors of the module.

In some embodiments, the technology includes cooling features. In one embodiment, a cooling feature includes surrounding all or at least part of the circuitry with a cooling fluid to promote direct cooling.

Further features and advantages, as well as the structure and operation of various embodiments, are described in more detail below with reference to the accompanying drawings. The technology is not limited to the specific embodiments described herein. The embodiments are presented herein for illustrative purposes only. Additional embodiments will be apparent to persons skilled in the relevant art(s) based on the teachings contained herein.

IV. BRIEF DESCRIPTION OF THE DRAWINGS

Exemplary embodiments may take form in various components and arrangements of components. Exemplary embodiments are illustrated in the accompanying drawings, throughout which like reference numerals may indicate corresponding or similar parts in the various figures.

The drawings are only for purposes of illustrating preferred embodiments and are not to be construed as limiting the technology. Given the following enabling description of the drawings, novel aspects of the present technology will be evident to a person of ordinary skill in the art.

V. DETAILED DESCRIPTION OF THE EMBODIMENTS

While exemplary embodiments are described herein with illustrative embodiments for particular implementations, it should be understood that the technology is not limited thereto. Those skilled in the art with access to the teachings provided herein will recognize additional modifications, applications, and embodiments within the scope thereof, and additional fields in which the compact, stacked power modules described herein would be of significant utility.

In various embodiments, the structure includes half-bridge or H-bridge circuits comprising semiconductor switches, arranged in parallel with at least one conductor, between adjacent positive and negative direct-current (DC)-bus-voltage plates and an alternating-current (AC) output plate.

A. HALF-BRIDGE POWER MODULE—FIGS. 1-3

Figure 1:
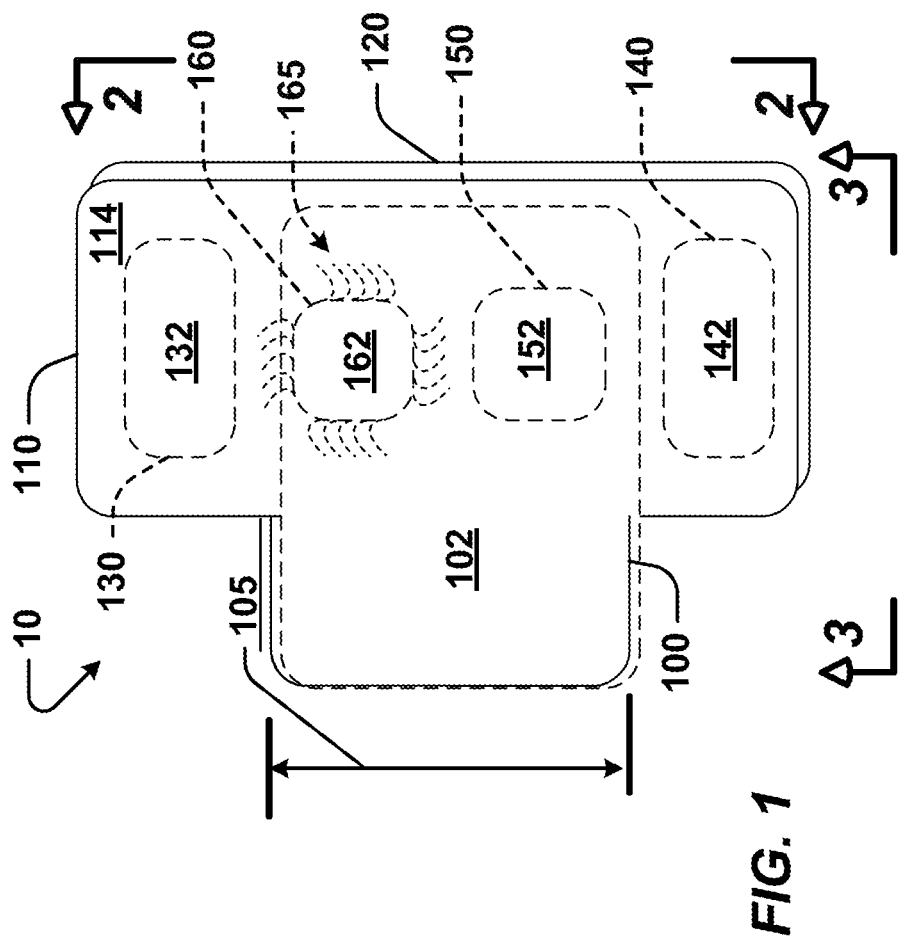
FIG. 1 is a plan view of a compact, stacked half-bridge power module according to an embodiment of the present technology.

Turning to the figures, and more particularly the first figure, FIG. 1 is a plan view of a compact, stacked power module or system 10. The stacked power module 10 of FIG. 1 is configured as a half-bridge.

Figure 2:
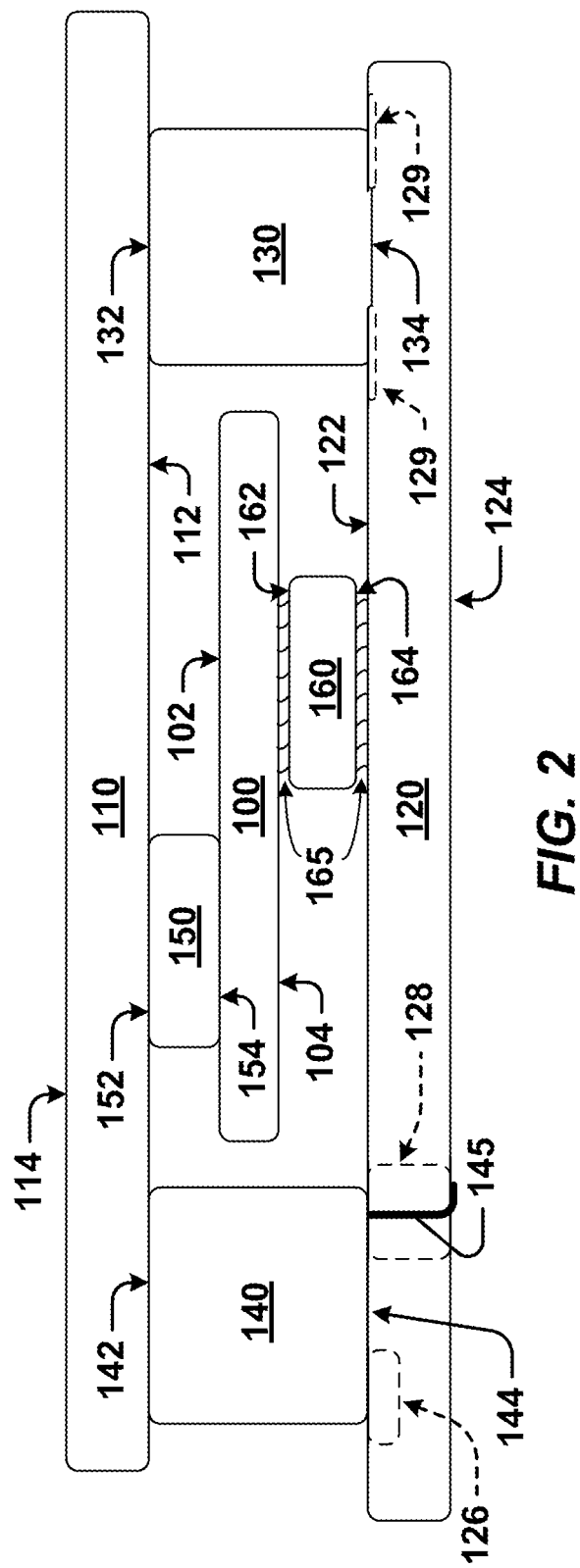
FIG. 2 is a first side view of the compact, stacked half-bridge power module from the perspective of arrows 2-2 show in FIG. 1.
Figure 3:
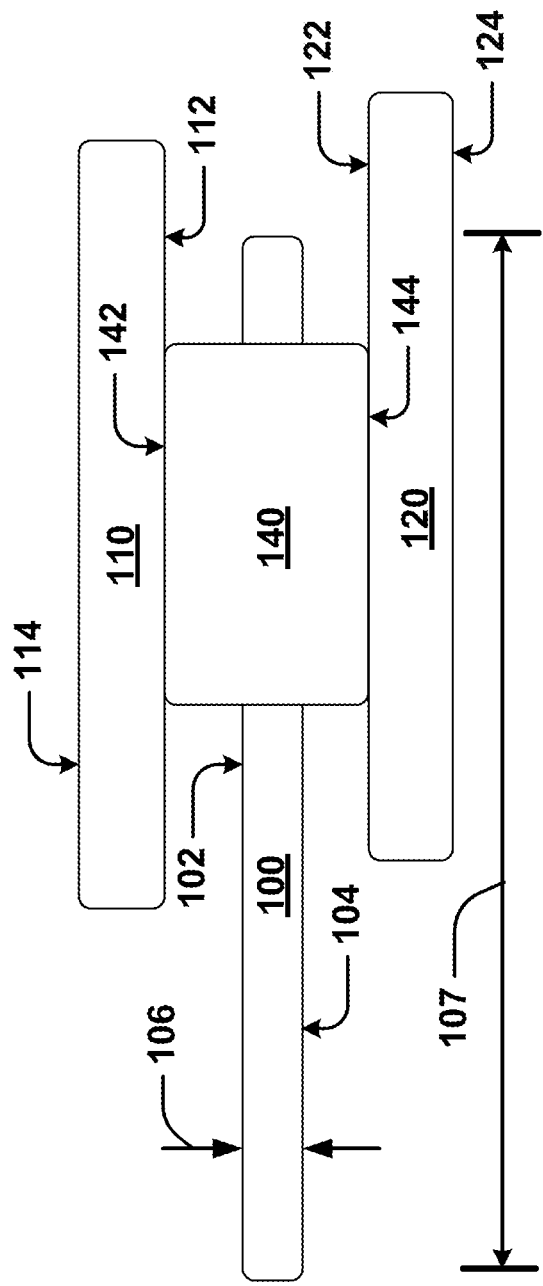
FIG. 3 is another side view of the compact, stacked half-bridge power module from the perspective of arrows 3-3 show in FIG. 1.
Figure 4:
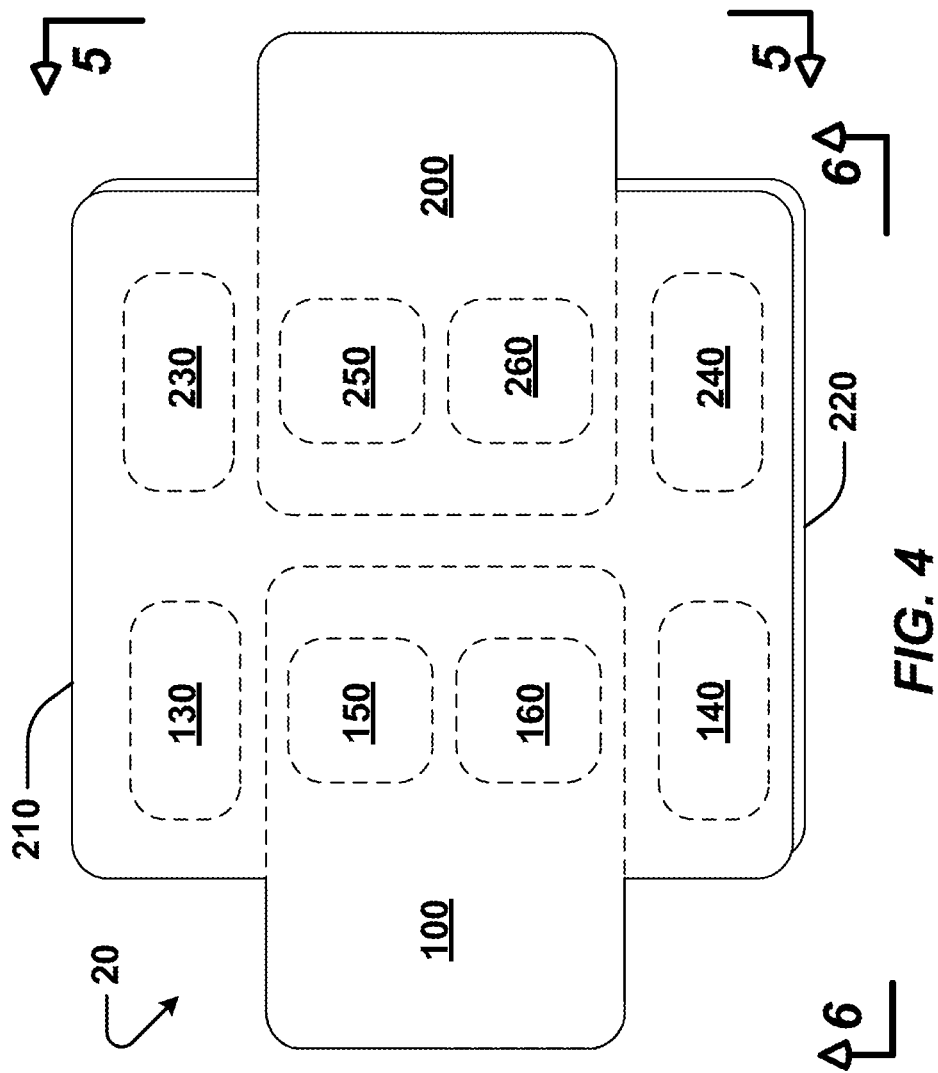
FIG. 4 is a plan view of a compact, stacked H-bridge power module according to an embodiment of the present technology.
Figure 5:
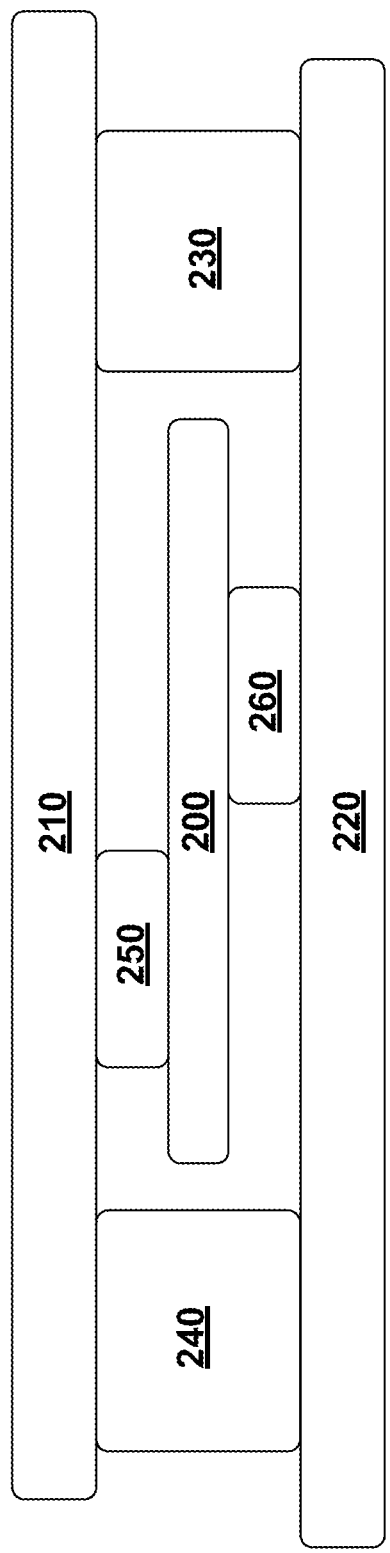
FIG. 5 is a first side view of the compact, stacked H-bridge power module from the perspective of arrows 5-5 show in FIG. 4.
Figure 6:
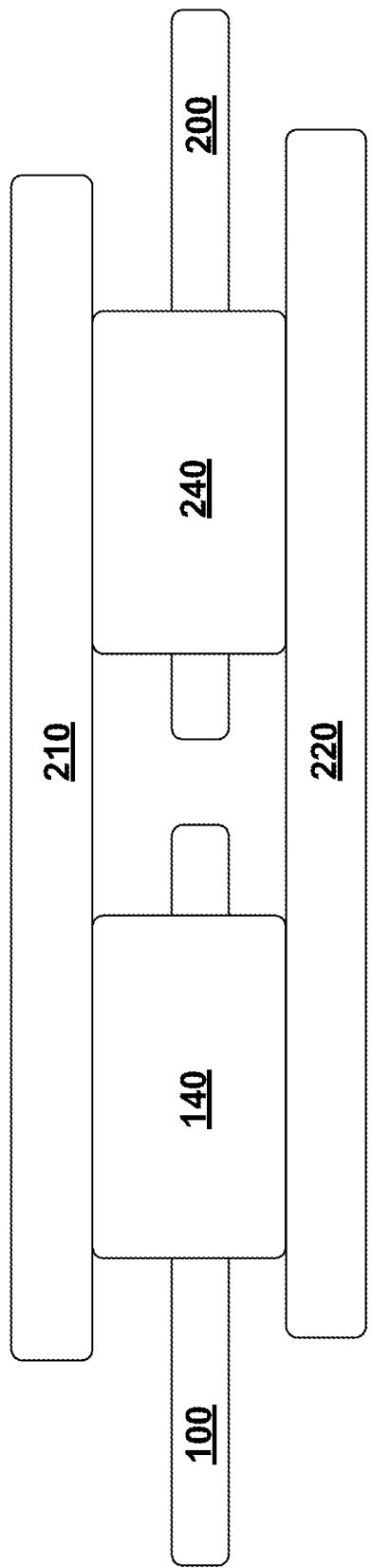
FIG. 6 is another side view of the compact, stacked H-bridge power module from the perspective of arrows 6-6 show in FIG. 4.

FIG. 2 is a first side view of the stacked half-bridge power module of FIG. 1, taken along line 2-2 of FIG. 1. FIG. 3 is another side view of the stacked half-bridge power module of FIG. 1, taken along line 3-3 of FIG. 1. FIGS. 4-6 show views of a second example stacked power module 20.

While one half-bridge and one H-bridge are shown in FIGS. 1-3 and 4-6, respectively, the present technology can be used to make any number of such bridges connected together, with any number of capacitors and switches, such as two or more H-bridges stacked together to form multi-level bridges—e.g., modular multilevel converters (M2Cs). Each additional bridge would provide an additional amount of voltage to the overall module.

The power modules 10, 20 of the present technology are smaller, or minimized, in one or more dimensions, as compared to conventional circuits, to minimize commutating inductance in loops of the power modules.

The compact, stacked power module 10 of FIG. 1 includes an alternating-current (AC) output bar or plate 100. The AC output plate 100 includes a first AC output-plate surface 102 opposite a second AC output-plate surface 104 (FIG. 2).

The AC output plate 100, and each plate described herein, can have any of a variety of geometries and materials. For instance, in various embodiments, the AC output plate 100 can have a width 105 that is substantially larger than a thickness 106 of the AC output plate 100. The width 105 is in various embodiments between about 10× to 20× as large as the thickness 106, or larger, for instance. In various embodiments, the AC output plate 100 can have a length 107 that is substantially larger than the thickness 106 of the AC output plate 100. The length 107 is in various embodiments between about 10× to 20× as large as the thickness 106, or larger, for instance. Similar geometries, regarding width and/or length, can be applied to the other bars or plates described herein.

In various embodiments, one or more of the plates described herein comprise copper. And in various embodiments, one or both of primary opposing surfaces of the AC output plate, and of each plate described herein, is substantially planar. Opposing surfaces of other components, such as the capacitors and semiconductor switches can also be generally planar. Planarities of adjacent surfaces, such as of a switch contacting the AC output plate, increase contact and so promote efficient transfer of current between the surfaces.

Electrical terminals described herein—i.e., AC output terminals and positive and negative DC terminals—are described primarily herein as bars or plates. The references are not meant to necessarily limit the geometry with which the terminals can be implemented. While terminals are referred to primarily as plates, for instance, the terminals are not limited to having a uniform thicknesses, or being completely flat. In various embodiments, the terminals are substantially flat, and significantly longer then they are thick. In some cases, they are also substantially wider than thick.

The compact, stacked power module 10 also includes a negative direct-current (DC) bus-voltage bar or plate 110 having a first negative-plate surface 112 opposite a second negative-plate surface 114.

The compact, stacked power module 10 also includes a positive DC-bus-voltage bar or plate 120. The positive DC-bus-voltage plate 120 has a first positive DC-plate surface 122 opposite a second positive DC-plate surface 124.

The positive and negative DC-bus-voltage plates 120, 110 represent respective phases of the power module 10. Each of the plates 110, 120, or at least the positive DC-bus-voltage plate 110, can be referred to as substrate.

The compact, stacked power module 10 further includes a first capacitor 130. The capacitor is a ceramic capacitor in various embodiments. In some implementations, the capacitor 130 has a multilayer ceramic capacitor (MLCC) construction.

The capacitor 130 includes a first capacitor surface 132 opposite a second capacitor surface 134. The first capacitor surface 132 is connected to, or at least is arranged in the module 10 to contact, the first negative-plate surface 112 of the negative DC-bus-voltage plate 110. The second capacitor surface 134 is connected to, or at least is arranged in the module 10 to contact, the first positive-plate surface 122.

The compact, stacked power module 10 further includes a plurality of switches. In various embodiments, the switches include a first semiconductor switch 150.

The switch 150 can be configured in any of a wide variety of ways. The switch 150 can include an insulated-gate bipolar transistor (IGBT), for instance, or a metal-oxide-semiconductor field-effect transistor (MOSFET).

The switch 150 includes a first switch surface 152 opposite a second switch surface 154. The first switch 150 is arranged in the module 10 so that its first surface 152 is connected to, or at least contacts, the first negative-plate surface 112 of the negative DC-bus-voltage plate 110. The second switch surface 154 is connected to, or at least is arranged in the module 10 to contact, the first AC-output-plate surface 102.

The compact, stacked power module 10 also includes a second semiconductor switch 160. The second switch 160 can be like the first switch 150, such as by being an IGBT or MOSFET.

The second switch 160 includes opposing switch surfaces 162, 164. The first surface 162 is connected to, or at least is arranged in the module 10 to contact, the second AC-output-plate surface 104. The second surface 164 of the surfaces 162, 164 is connected to, or at least is arranged in the module 10 to contact, the first positive-plate surface 122.

The module 10 can include additional switches, as described further below.

Any or all of the switches illustrated can have bond wires extending therefrom and connected to the adjacent substrate. Only by way of example, bond wires 165 are show extending from the semiconductor switch 160 in FIGS. 1 and 2. Bond wires 165 can connect each subject semiconductor switch to either or both plates to which the switch is connected. By way of example, FIG. 2 shows the switch 160 connected by the bond wires 165 to both the AC output plate 100 and the positive DC plate 120. The same configurations can be provided for any or all of the switches shown and described in connection with the other switches—e.g., the embodiments of FIGS. 4-6.

The switches 150, 160 can be referred to by other names and have various configurations, such as power switch, and chips.

Each switch 150, 160 comprises, in various embodiments, a built-in body diode (not shown in detail for simplicity). In some of the embodiments in which the switch does not include a built-in body diode, the module 10 includes a diode (not shown in detail) connected, between the negative-plate surface 112 and the first output-plate surface 102, in parallel with the corresponding capacitor(s).

In one embodiment, the compact, stacked power module 10 includes one or more additional capacitors, such as the illustrated second capacitor 140. Each additional capacitor extends between the positive and negative DC plates 120, 110. The additional capacitors can in any way be like the first capacitor 130 described above. They can each be a ceramic capacitor, for instance, and could have an MLCC construction.

Regarding adding capacitors, it has been determined that overall series inductance in the module 10 associated with the switches and capacitors is reduced by the number of capacitors placed in parallel. Variables for determining the number of capacitors to include in the power module 10 also include (a) reliability and (b) current and/or voltage requirements.

Regarding the reliability variable (a), having less capacitors may increase reliability slightly due to reduced complexity and current routes as compared to systems having more capacitors.

Regarding the current/voltage variable (b), capacitor ratings—e.g., voltage and/or current ratings—can affect how many and which types of capacitors are used. The capacitor(s) selected would need to accommodate the voltage and current output capability needed for the subject application.

The second capacitor 140 includes a first capacitor surface 142 opposite a second capacitor surface 144. The first capacitor surface 142 is connected to, or at least is arranged in the module 10 to contact, the first negative-plate surface 112. The second capacitor surface 144 is connected to, or at least is arranged in the module 10 to contact, the first positive-plate surface 122.

It should be appreciated that, according to the circuit structure illustrated in FIG. 1, each of the capacitors 130, 140 is positioned electrically in parallel with the first and second semiconductor switches 150, 160, between the positive and negative DC phase terminals 120, 110 and the AC output plate 100.

B. H-BRIDGE POWER MODULE—FIG. 4-6

FIG. 4 is a plan view of a compact, stacked power module or system 20 configured as a full H-bridge. FIG. 5 is a first side view of the stacked H-bridge power module taken along line 5-5 of FIG. 4. FIG. 6 is another side view of the stacked H-bridge power module of FIG. 1, taken along line 6-6 of FIG. 4.

As with the first illustrated module 10 of FIG. 1, the second module 20 is smaller, or minimized, in one or more dimensions, as compared to conventional circuits, to minimize commutating inductance in loops of the module 20.

The compact, stacked power module 20 includes connected two of the half-bridge modules 10 of FIGS. 1-3. The power module 20 includes, on a first side (left side of the view of FIG. 4) of the module 20, the AC output plate 100 and positive and negative DC bus-voltage plates 120, 110. The opposing surfaces of these components are labeled in FIGS. 1-3 but not FIGS. 4-6 to simplify these views. The compact, stacked power module 20 of FIGS. 4-6 also includes the capacitors 130, 140 and semiconductor switches 150, 160 described in FIG. 1.

On a second side (right side of the view of FIG. 4), the module 20 can include substantially similar structure as the first side. The two sides have respective AC output plates 100, 200 and share the positive and negative DC bus-voltage plates. The DC bus-voltage plates 210, 220 can be the same as or similar to the plates 110, 120 of FIGS. 1-3. The plates 210, 220 can be longer and/or wider for the full H-bridge arrangement, as shown in FIGS. 4-6, to extend across the first and second sides of the module 20.

The second side of the power module 10 includes third and fourth capacitors 230, 240 and third and fourth semiconductors switches 250, 260 like the first and second capacitors 130, 140 and the first and second semiconductors switches 150, 160 of the first side.

The module 20 can include additional capacitors, such as the illustrated fourth capacitor 240. Each additional capacitor extends between the positive and negative DC plates 220, 210. As mentioned regarding adding capacitors, it has been determined that overall series inductance in the module 20 associated with the switches and capacitors is reduced by the number of capacitors placed in parallel.

The components and structure of the second example module 20 can otherwise be like the components and structure of the first example module 10. For instance, any of the capacitors of the second example module 20 can also be ceramic capacitors, and can have an MLCC construction. As with the first and second semiconductor switches 150, 160, each of the third and fourth semiconductor switches 250, 260 can include, in various embodiments, a built-in body diode (not shown in detail for simplicity). In some embodiments in which any switch 250, 260 does not include a built-in body diode, the module 20 can include a diode (not shown in detail) connected in parallel with the switch 250, 260, between the adjacent, positive or negative, DC-plate surface and corresponding AC output-plate surface. And any of the switches of the module 20 can include an IGBT or MOSFET. The module 20 can include additional switches, and additional half-bridges or H-bridges can be added to the power module.

It should be appreciated that, according to the circuit structure illustrated in FIGS. 4-6, each of the first-side capacitors 130, 140 are positioned electrically in parallel with the corresponding semiconductor switches 150, 160 on that side, and each of the second-side capacitors 230, 240 are positioned electrically in parallel with the corresponding semiconductor switches 250, 260 on that side.

C. STRAIN RELIEF FEATURES

In various embodiments the structure of the power modules 10, 20 includes one or more features configured and arranged in the module to relieve strain that may develop in capacitors or switches. While relieving strain is described primarily herein, the references can include relieving stress and other forces affecting capacitors.

Capacitors can be especially susceptible to damage. Relieving strain helps keep capacitors intact, such as from cracking or becoming compromised otherwise.

Relieving strain in connection with capacitor positioning and operation is described primarily below for simplicity, but use in connection with any module switches is contemplated.

In various embodiments, the strain relief includes components configured and arranged in the module 10, 20 to provide increased levels of either flexibility or softness in the module 10, 20 adjacent target components (e.g., capacitors). In this way, mechanical forces, such as stress and strain, passing across or through the components are limited. Mechanical forces can result from various sources, such as vibrations developed in module operations, for instance, or indirectly from other effects such as thermal cycling in or adjacent the module 10, 20.

Regarding adding flexibility (A) as a strain relief, flexibility can be provided to limit capacitor movement, and/or movement of part(s) adjacent the subject capacitor.

Regarding adding softness or damping (B) as a strain relief, softening or damping structure is provided to absorb mechanical forces in the module 10, 20, thereby limiting the amount of force expressed to the subject capacitor.

In some embodiments, the strain relief feature includes the subject capacitor being connected to an adjacent surface, such as the positive DC plate surface 122, by one or more leads. The leads can be used in lieu of surface mounting, such as by adhesive, or in addition to some surface mounting. A single example lead is indicated by reference numeral 145 in FIG. 2. Two or more leads can connect each subject capacitor to the adjacent surface(s) adjacent the component.

In one of the embodiments, the strain-relief feature includes at least one of the adjacent plates, to which the subject component contacts, having a first material primarily, and a second material, softer than the first, adjacent the capacitor. The softer material can be embedded in or otherwise provided in or adjacent the primary material of the substrate—e.g., positive DC plate 120—to relieve strain that would otherwise affect the capacitor in operation of the power module 10, 20.

The second material can be positioned where the capacitor is mounted on or connected to the plate. The second material can receive leads from the capacitor, like that referenced by numeral 145, for instance, which can further increase damping.

The second material is indicated by reference numerals 126, 128 in FIG. 2 by way of example. The second material can be formed to have any of a variety of geometries—e.g., size and shape. The second material can form a ring, a disc or discs, or extend in straight or curved fingers or extensions positioned to any depth in the plate 120, for instance. In one embodiment size, shape, and positioning of the second material is selected to match size, shape, and/or placement of the capacitor, which can include placement of leads of the capacitor.

The first and second materials 126, 128 can include any of a wide variety of materials. In various embodiments, the first material is copper and the second material is one of a copper alloy, gold, or mercury, In various embodiments, the strain-relief feature includes one or more grooves formed in a plate. The groove operates to relieve strain that may develop in or adjacent the capacitor 130 of the module 10 when the power module 10 is being used.

The groove or grooves are provided at or adjacent where a capacitor will be mounted, to relieve strain in operation of the compact, stacked power module 10. Example grooves are indicated by reference numerals 129 in FIG. 2. The groove(s) can be formed with any appropriate size and shape, and at any location. The groove(s) can form a ring, a disc or discs, or extend in straight or curved fingers or extensions to any depth, along the surface of the plate—e.g., plate 120, for instance.

D. COOLING FEATURES

In some embodiments, the technology includes cooling functions or features. In one embodiment, cooling is accomplished by surrounding at least part of the power module 10, 20 with a cooling fluid (not shown in detail) to promote direct cooling during operation of the module 10, 20. In operation, an entirety of the power module 10, 20 can be submerged in a cooling fluid, such as a non-conductive cooling fluid, to promote the direct cooling.

These functions can include dipping or dunking some or all of the power module 10, 20 into the fluid. The cooling fluid could be non-conductive or a phase-change fluid, for instance.

The module and cooling arrangements can be configured to promote heat flow away from the module 10, 20 in any of a variety of ways. Generally, the arrangements are configured so that heat flows out of the module 10, 20 and into the cooling fluid (not referenced in detail; can be considered to surround any of the illustrated modules). For instance, in one embodiment, the arrangements are configured so that heat flows out of the module 10, 20 and into the cooling fluid largely, mainly, or entirely through any one or more of the plates 100, 110, 120 disclosed—e.g., copper AC-output bus bar and copper+/−DC-bus-voltage bus bars. The heat flows, in some implementations, mainly or entirely from the plates at or adjacent (e.g., on sides of) where the semiconductor chips 150, 160 are mounted to the respective bars.

In some embodiments, the arrangements are configured so that heat leaves the module 10, 20 by flowing directly to the cooling fluid from the semiconductor 150, 160, where the semiconductor is exposed directly to the cooling fluid.

Relevant cooling techniques that can be used with the present technology are also disclosed in applications and patents of General Electric, including but not limited to U.S. Pat. No. 8,711,565, which describes methods of using non-conductive cooling fluid for direct cooling and which is hereby incorporated herein.

E. METHODS OF OPERATION—FIG. 7

Figure 7:
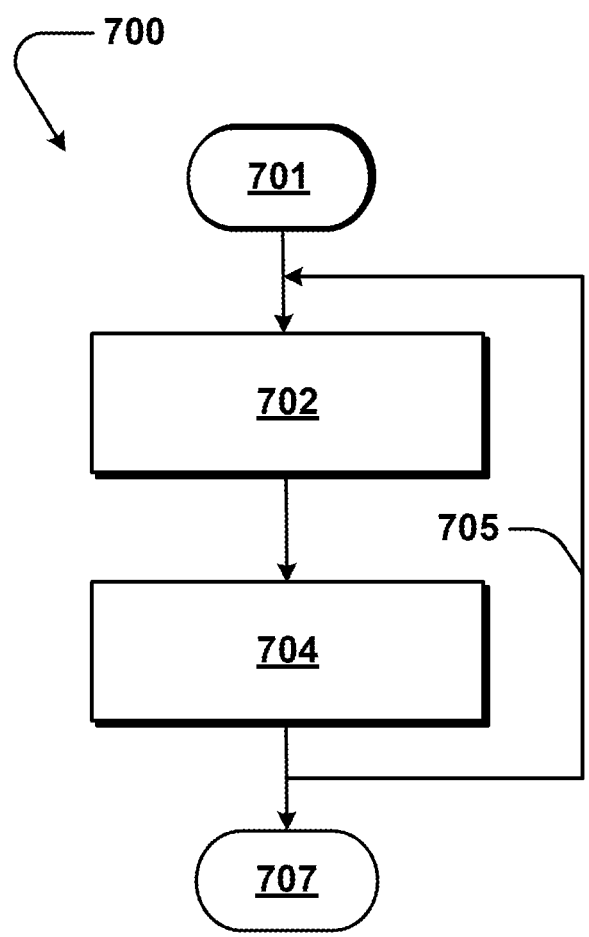
FIG. 7 shows a flow chart representing a method of making the ultra-compact power modules of the present technology.

FIG. 7 is a flow chart showing operations of a method 700 performed according to the present technology.

Operations, or steps, of the method 700 are not necessarily presented in any particular order and that performance of some or all the steps in an alternative order is possible and is contemplated. The steps have been presented in the demonstrated order for ease of description and illustration. Steps can be added, omitted and/or performed simultaneously without departing from the scope of the appended claims. The illustrated method 700 can be ended at any time.

The method 700 is used to make an ultra-compact, stacked power module, like the modules 10, 20 described. The method 700 may be performed by one or more actors, such as personnel and/or computer-controlled machinery—e.g., robotics. The method is described below primarily with respect to robotics.

The method 700 begins 701 and flow proceeds to block 702, whereat robotics arranges a capacitor 130, a positive DC-bus-voltage plate 120, and a negative DC-bus-voltage plate 110 as shown in FIG. 1 or 4.

Namely, the robotics positions the capacitor 130 between the plates 110, 120, in contact with the positive-plate surface 122, of the positive DC-bus-voltage plate 120, and the negative-plate surface 112 of the negative DC-bus-voltage plate 110.

At block 704, the robotics arranges the AC output plate 100, a first semiconductor switch 150, and a second semiconductor switch 160 between the positive and negative DC-bus-voltage plates 120, 110/220, 210 as shown in FIG. 1 in one embodiment, and FIG. 4 in another embodiment.

The module is arranged such that:

The first semiconductor switch 150 contacts the first negative DC-plate surface 112 and the first AC output-plate surface 102 of the AC output plate 100; and The second semiconductor switch 160 contacts the first positive-plate surface 122 and The second AC output-plate surface 104 of the AC output plate 100.

The operations can be performed further to create the second example compact, stacked power module 20 of FIGS. 4-6.

The operations can include connecting any of the surfaces, such as by surface mounting techniques and/or leaded connections.

The process 700 can be repeated, to make an additional power module 10, 20, as indicated by return route 705, or the method can be ended 707.

F. BENEFITS AND ADVANTAGES

This section elaborates on benefits of the present technology described above.

Primary benefits include eliminating or at least greatly reducing commutating inductance that would otherwise develop in circuit loops between switches and a local capacitor of power modules such as those including half-bridge and H-bridges.

Power modules configured according to the present technology, with lower commuting inductances, have higher power densities than conventional technologies and improved reliability.

The ultra-compact power modules of the present technology, being smaller in one or more dimensions, are also preferred because of their compactness. They can be used to provide equivalent or higher power output than conventional systems, for instance, by way of a smaller package.

The power modules of the present technology can be used in a variety of power-related systems such as generators. Example systems include wind converters and solar inverters.

The strain-relief features of the present technology eliminate or at least reduce forces that may otherwise develop in power module components, such as capacitors. Capacitors perform better and have longer life when not compromised, such as by slight strain-induced cracking.

The present technology can also include cooling features promoting cooling of the power modules described. Cooled modules are less vulnerable to damage and perform better than modules for which the temperature is not controlled.

G. CONCLUSION

Alternative embodiments, examples, and modifications that would still be encompassed by the technology may be made by those skilled in the art, particularly in light of the foregoing teachings. Further, it should be understood that the terminology used to describe the technology is intended to be in the nature of words of description rather than of limitation.

Those skilled in the art will also appreciate that various adaptations and modifications of the preferred and alternative embodiments described above can be configured without departing from the scope and spirit of the technology. Therefore, it is to be understood that, within the scope of the appended claims, the technology may be practiced other than as specifically described herein.

What is claimed:

1. A compact stacked power module including positive and negative direct-current-bus-voltage plates having respective positive and negative plate surfaces, the module comprising:

an alternating-current output plate having a first output-plate surface opposite a second output-plate surface;
a first semiconductor switch contacting the negative-plate surface and the first output-plate surface;
a second semiconductor switch contacting the positive-plate surface and the second output-plate surface; and
a capacitor (i) contacting the negative and positive plate surfaces and (ii) connected in parallel with the first and second semiconductor switches.

2. The compact stacked power module of claim 1, wherein at least one of the plates comprises a groove adjacent the capacitor to relieve forces in the module before the forces reach the capacitor in operation of the compact stacked power module.

3. The compact stacked power module of claim 1, wherein the positive direct-current-bus-voltage plate comprises a first material, primarily, and adjacent the capacitor, a second material softer than the first material to relieve forces developing in the module before the forces reach the capacitor in operation of the compact stacked power module.

4. The compact stacked power module of claim 3, wherein the first material is copper and the second material is a copper alloy.

5. The compact stacked power module of claim 3, wherein the second material is selected from a group consisting of gold, mercury, and a copper alloy.

6. The compact stacked power module of claim 1, wherein the capacitor is a leaded capacitor, connected by lead to the positive direct-current-bus-voltage plate to relieve forces developing in the module before the forces reach the capacitor in operation of the compact stacked power module.

7. The compact stacked power module of claim 1, wherein the capacitor is a first capacitor and the compact stacked power module comprises a second capacitor contacting the second negative-plate surface and the positive-plate surface and being electrically in parallel with the first and second semiconductor switches.

8. The compact stacked power module of claim 1, wherein the positive direct-current-bus-voltage plate, the negative direct-current-bus-voltage plate, and the alternating-current output plate are copper bus plates.

9. The compact stacked power module of claim 1, wherein each of the first and second semiconductor switches comprises an insulated-gate bipolar transistor or a metal-oxide-semiconductor field-effect transistor.

10. The compact stacked power module of claim 1, wherein each of said surfaces is substantially planar.

11. The compact stacked power module of claim 1, wherein:
the alternating-current output plate is a first alternating-current output plate;
the capacitor is a first capacitor; and
the compact stacked power module further comprises:
a second alternating-current output plate comprising a third output-plate surface opposite a fourth output-plate surface;
a second capacitor extending between the negative-plate surface and the positive-plate surface;
a third semiconductor switch contacting the negative-plate surface and the third output-plate surface; and
a fourth semiconductor switch contacting the positive-plate surface and the fourth output-plate surface.

12. The compact stacked power module of claim 1, wherein the first semiconductor switch comprises a built-in body diode.

13. The compact stacked power module of claim 1, further comprising a diode connected in parallel with the first semiconductor switch between the positive-plate surface and the first output-plate surface.

14. The compact stacked power module of claim 1, wherein each of said plates has a width that is substantially greater than a thickness of the plate and a length that is substantially greater than the thickness of the plate.

15. The compact stacked power module of claim 14, wherein the width of each plate is at least ten times the width of the plate and the length is at least ten times the width of the plate.

16. The compact stacked power module of claim 1, wherein the capacitor is a first capacitor and the compact stacked power module comprises a second capacitor contacting the second negative-plate surface and the positive-plate surface electrically in parallel with the first and second semiconductor switches.

17. A method, for making a compact stacked power module, comprising:
   arranging a capacitor, a positive direct-current-bus-voltage plate, and a negative direct-current-bus-voltage plate, wherein the capacitor is positioned between the positive direct-current-bus-voltage and the negative direct-current-bus-voltage plates, in contact with a positive-plate surface of the positive direct-current-bus-voltage plate and a negative-plate surface of the negative direct-current-bus-voltage plate; and
   arranging an alternating-current output plate, a first semiconductor switch, and a second semiconductor switch between the positive and negative direct-current-bus-voltage plates, wherein:
   the first semiconductor switch contacts the negative-plate surface and a first output-plate surface of the alternating-current output plate; and
   the second semiconductor switch contacts the positive-plate surface and a second output-plate surface of the alternating-current output plate.

18. The method of claim 17, wherein each of said plates has a width that is substantially greater than a thickness of the plate and a length that is substantially greater than the thickness of the plate.

19. A compact stacked power module comprising:
   a positive direct-current-bus-voltage plate;
   a negative direct-current-bus-voltage plate;
   a capacitor extending between and in contact with the positive and negative direct-current-bus-voltage plates;
   two semiconductor switches arranged electrically in parallel with the capacitor; and
   a strain-relief feature selected from a group consisting of:
   one of the direct-current-bus-voltage plates comprising a groove adjacent the capacitor;
   one of the direct-current-bus-voltage plates comprising a first material primarily and a second material, softer than the first material, adjacent the capacitor; and
   the capacitor being a leaded capacitor, connected to at least one of the direct-current-bus-voltage plates by one or more leads.

20. The compact stacked power module of claim 19, wherein each of said plates has a width that is substantially greater than a thickness of the plate and a length that is substantially greater than the thickness of the plate.

* * * * *